United States Patent [19]

Ogiu et al.

[11] Patent Number: 5,098,630
[45] Date of Patent: Mar. 24, 1992

[54] METHOD OF MOLDING A SOLID STATE IMAGE PICKUP DEVICE

[75] Inventors: Hisao Ogiu, Oume; Takeji Takagi, Machida; Toshio Tanaka, Aizuwakamatsu, all of Japan

[73] Assignee: Olympus Optical Co., Ltd., Tokyo, Japan

[21] Appl. No.: 397,376

[22] Filed: Aug. 21, 1989

Related U.S. Application Data

[60] Continuation of Ser. No. 131,340, Dec. 9, 1987, abandoned, which is a division of Ser. No. 932,650, Oct. 28, 1986, abandoned.

[30] Foreign Application Priority Data

Mar. 8, 1985 [JP] Japan ............................ 60-46036
Mar. 6, 1986 [WO] PCT Int'l Appl. ..... PCT/JP88/00115

[51] Int. Cl.$^5$ ............................................ B29C 39/10
[52] U.S. Cl. ............................ 264/272.15; 264/1.7; 264/272.17; 357/72; 425/117
[58] Field of Search .................... 264/272.16, 272.17, 264/272.15, 1.7; 425/116, 125, 117; 357/72, 30 G, 30 M

[56] References Cited

U.S. PATENT DOCUMENTS

| H445 | 3/1988 | Bock | 264/272.16 |
|---|---|---|---|
| 2,586,609 | 2/1952 | Burke, Jr. | 357/72 |
| 3,367,025 | 2/1968 | Doyle | 357/72 |
| 3,389,267 | 6/1968 | Aconsky | 357/72 |
| 3,560,813 | 2/1971 | Phy | 357/72 |
| 3,622,419 | 11/1971 | London et al. | 357/72 |
| 3,805,347 | 4/1974 | Collins et al. | 357/73 |
| 3,875,456 | 4/1975 | Kano et al. | 357/783 |
| 3,908,184 | 9/1975 | Anazawa et al. | 357/73 |
| 4,001,863 | 1/1977 | Kobayashi et al. | |
| 4,032,963 | 6/1977 | Thome | 437/219 |
| 4,203,792 | 5/1980 | Thompson | 264/272.17 |
| 4,224,081 | 9/1980 | Kawamura et al. | |
| 4,231,807 | 11/1980 | Keeling et al. | |
| 4,241,493 | 12/1980 | Andrulitis et al. | |
| 4,410,469 | 10/1983 | Katagiri et al. | 264/272.17 |
| 4,442,456 | 4/1984 | Iwata et al. | 358/213 |
| 4,451,973 | 6/1984 | Tateno et al. | 264/272.17 |
| 4,486,364 | 12/1984 | Takahashi | 264/272.16 |
| 4,746,392 | 5/1988 | Hoppe | 264/272.17 |

FOREIGN PATENT DOCUMENTS

| 42390 | 4/1977 | Japan | 357/30 M |
|---|---|---|---|
| 44045 | 4/1978 | Japan | 264/1.7 |
| 148972 | 12/1978 | Japan | 357/73 |
| 33665 | 3/1979 | Japan | 264/272.17 |
| 91837 | 7/1980 | Japan | 264/272.16 |
| 182854 | 10/1983 | Japan | 437/219 |
| 110174 | 6/1984 | Japan | |
| 18941 | 1/1985 | Japan | 357/73 |
| 60-136345 | 7/1985 | Japan | 357/73 |

OTHER PUBLICATIONS

"Cost-Resin Embedments of circuit subunits and components", Javitz, *Electrical Manufacturing*, Sep. 51, pp. 103-118.

Patents Abstracts of Japan, vol. 5, No. 34 (E-48) (706), 4 Mar. 1981 & JP, A, 55159678 (Tokyo Shibaura Denki K.K.) 11 Dec. 1980, see abstract.

Patents Abstracts of Japan, vol. 7, No. 123 (E-178) (1268), 27 May 1983 & JP, A, 5840870 (Sanyo Denki K.K.) 9 Mar. 1983, see abstract.

*Primary Examiner*—James Lowe
*Attorney, Agent, or Firm*—Frishauf, Holtz, Goodman & Woodward

[57] ABSTRACT

A solid-state image pickup device comprises a semiconductor chip, a package with a recess in which said semiconductor chip is fixed, and a transparent protective member for protecting an image pickup surface of the semiconductor chip and guiding a light image onto the image pickup surface. The transparent protective member includes a transparent resin layer for covering the image pickup surface and the upper surface of the package without forming a space therebetween, and an incident surface formed on the resin layer in parallel to the image pickup surface. A method manufactures a solid-state image pickup device having a construction described above by using a mold.

3 Claims, 4 Drawing Sheets

METHOD OF MOLDING A SOLID STATE IMAGE PICKUP DEVICE

This application is a continuation of application Ser. No. 07/131,340, filed Dec. 9, 1987, now abandoned, and which is a division of application Ser. No. 06/932,650, filed Oct. 28, 1986, now abandoned.

TECHNICAL FIELD

The present invention relates to a solid-state image pickup device used in, for example, an endoscope, and a method of manufacturing the same.

BACKGROUND ART

A conventional solid-state image pickup device is disclosed in Japanese Patent Disclosure No. 59-18679. A semiconductor chip is fixed in a package, and a front opening of the package is covered with a transparent cap member to protect an image pickup surface of the semiconductor chip.

A mount portion is formed on a periphery of the package. The separate cap member is mounted on the mount portion. The resultant solid-state image pickup device inevitably has a large outer diameter along a direction parallel to the image pickup surface. For this reason, when such a device is built into an apparatus such as the insertion portion of an endoscope, which requires a compact or small-diameter arrangement, the insertion portion has a larger diameter, causing physical pain to a patient.

It is an object of the present invention to provide a solid-state image pickup device, dimensions of which can be reduced along a direction parallel to the image pickup surface, and a method of easily and systematically manufacturing the same.

SUMMARY OF THE INVENTION

According to a first invention, there is provided a solid-state image pickup device comprising a semiconductor chip, a package on which the semiconductor chip is fixed, and a transparent protective member for protecting an image pickup surface of the semiconductor chip and guiding a light image onto the image pickup surface, characterized in that the transparent protective member includes a transparent resin layer for covering at least the image pickup surface without forming a space therebetween, and an incident surface of the transparent protective member is formed parallel to the image pickup surface. According to a second invention, there is provided a method of manufacturing a solid-state image pickup device, characterized by comprising the steps of: placing a package with a semiconductor chip in a molding cavity of a mold such that an image pickup surface of the semiconductor chip is directed toward an opening of the molding cavity; pouring a transparent resin in a fluid state in the molding cavity; bringing a forming member onto the transparent resin in the molding cavity to set an incident outer surface of the transparent resin to be parallel to the image pickup surface of the semiconductor chip; curing the transparent resin in the fluid state; and releasing the forming member after the curing step. According to a third invention, there is provided a method of manufacturing a solid-state image pickup device, characterized by comprising the steps of: placing a package with a semiconductor chip in a molding cavity of a mold such that an image pickup surface of the semiconductor chip is directed toward an opening of the molding cavity; pouring a transparent resin in a fluid state in the molding cavity; bringing a transparent plate onto contact with an upper surface of a transparent resin layer in the molding cavity and setting an incident outer surface of the transparent plate to be parallel to the image pickup surface of the semiconductor chip; and curing the transparent resin in the fluid state after the contacting step. According to a fourth invention, there is provided a method of manufacturing a solid-state image pickup device, characterized by comprising the steps of: placing a package with a semiconductor chip in a molding cavity of a mold such that an image pickup surface of the semiconductor chip is directed toward an opening of the molding cavity; covering the molding cavity with a forming member with a space in the molding cavity and setting an inner surface of the molding member to be parallel to the image pickup surface of the semiconductor chip after the placing step; pouring a transparent resin in a fluid state in the space of the forming cavity after the covering step; curing the transparent resin in the fluid state after the pouring step; and releasing the forming member after the curing step.

DESCRIPTION OF THE PREFERRED EMBODIMENTS

Figure 1:
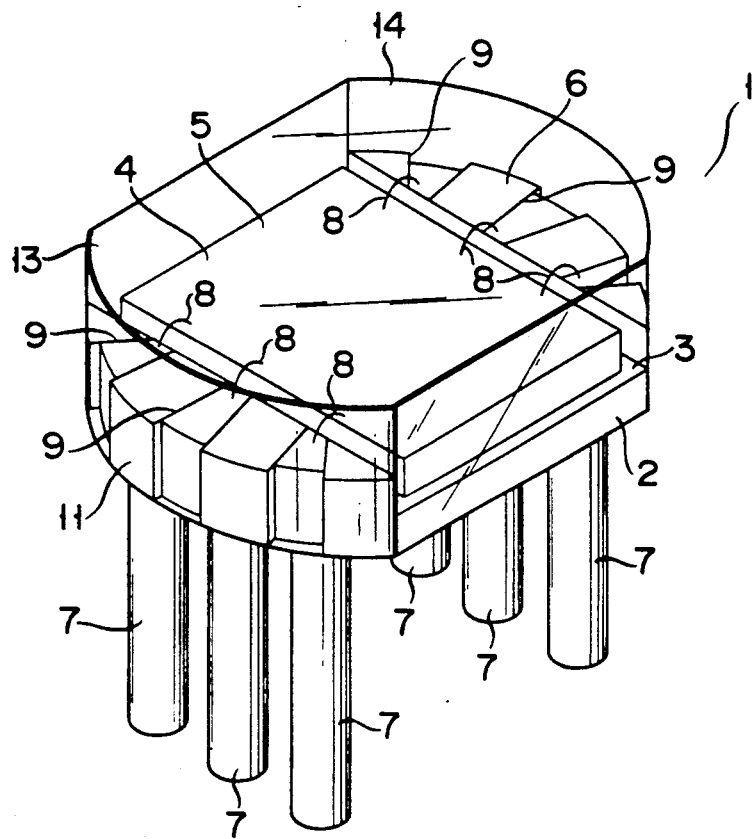
FIG. 1 is a perspective view of a solid-state image pickup device according to a first embodiment of the present invention.

FIG. 1 shows a solid-state image pickup device according to a first embodiment of the present invention. Solid-state image pickup device 1 is made of a synthetic resin. Both end faces of package 2 have an arcuated shape, and both side faces thereof have a linear shape. Rectangular recess 3 is formed in the upper surface portion of package 2. Semiconductor chip 4 is mounted and fixed in recess 3. Recess 3 has open ends at side faces of package 2. Dimensions of chip 4 are slightly smaller than those of recess 3 except for the height. Image pickup surface 5 is constituted by the upper surface of chip 4. A level of upper surfaces 6, at two ends of package 2 defining recess 3, is substantially the same as surface 5. A plurality of lead legs 7 extend from the lower surface of package 2. Lead wires 8 extending from chip 4 are guided toward two ends of package 2 and are electrically connected to legs 7, respectively.

Figure 3:
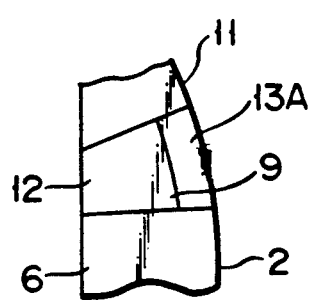
FIG. 3 is a plan view of the guide groove portion of FIG. 2.
Figure 2:
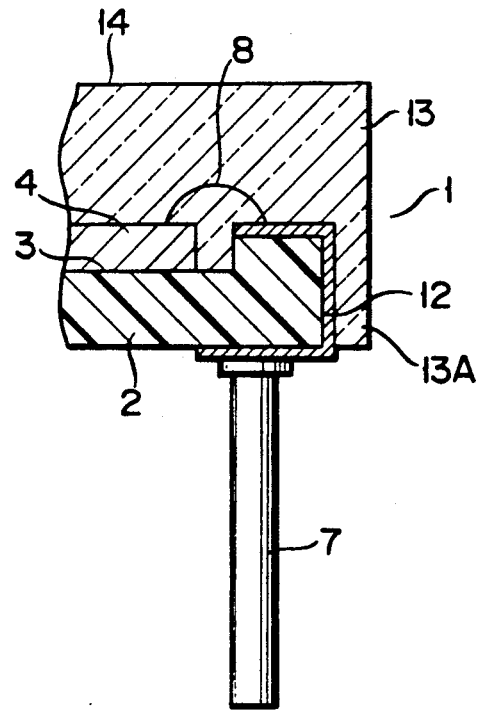
FIG. 2 is a side sectional view of a guide groove portion of the device of FIG. 1.

As shown in FIGS. 2 and 3, a plurality of guide grooves 9 are formed at both ends of package 2 and are spaced apart from each other. Grooves 9 extend from surface 6 to end face 11 of package 2. Conductive layer 12 of a metal (gold)-plated member is fitted in each groove 9. Layer portions at both end faces of package 2 are recessed from the surfaces of both ends of package 2. One end of each layer 12 is extended to the under face of package 2 and electrically connected to a corresponding one of legs 7. The other end of each layer 12 is electrically connected to a corresponding one of wires 8.

The upper surface of package 2 including chip 4 is covered with transparent resin layer 13 of a transparent protective member, e.g., epoxy resin, without forming a space therebetween. More specifically, the upper surface and both side surfaces of chip 4 including surface 5 are sealed. At the same time, the space between the end inner faces of recess 3 and both ends of chip 2 is also sealed with resin layer 12. Furthermore, top surfaces 6 at both ends of package 2 are covered and sealed. The resin is also injected in grooves 9 so that layers 12 are covered by extended portions 13A of layer 13.

Side surface level of layer 13 is the same as that of package 2. Incident surface 14 as an outer surface of layer 13 is parallel to surface 5 of chip 4.

Figure 4:
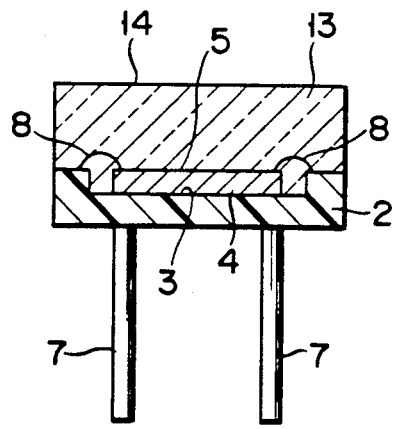
FIG. 4 is a sectional view showing a basic structure of the solid-state image pickup device according to the first embodiment.

FIG. 4 shows a basic sectional structure of device 1.

According to the arrangement described above, since the upper surfaces including surface of chip 4 and package 2 are covered and sealed, a separate protective member need not be mounted at the peripheral portion of package 2. For this reason, an outer diameter along a direction parallel to surface 5 can be decreased.

Figure 5:
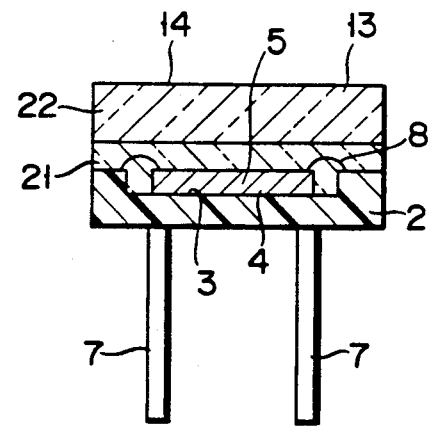
FIG. 5 is a sectional view showing a basic structure of a solid-state image pickup device according to a second embodiment of the present invention.

FIG. 5 shows a second embodiment of the present invention. In this embodiment, transparent resin layer 13 is constituted by two layers. More specifically, layer 13 consists of first transparent resin layer 21, covering and sealing the upper surfaces including surface 5 of chip 4 and package 2, and second transparent resin layer 22 covering layer 21, with this arrangement, layer 21 protects chip 4. In this sense, high precision is not required for layer 21. Surface 14 of layer 22 is formed with high precision in the same manner as in the first embodiment. The resin of layer 22 has good resistance to the atmosphere. According to this embodiment, layer 21 can be easily formed.

Figure 6:
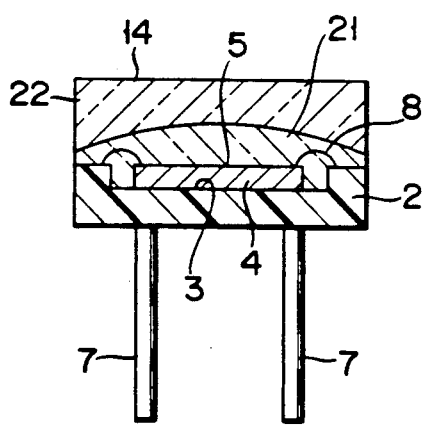
FIG. 6 is a sectional view showing a basic structure of a solid-state image pickup device according to a third embodiment of the present invention.

FIG. 6 shows a third embodiment of the present invention. The transparent resin layer is constituted by two layers in the same manner as in the second embodiment. However, unlike in the second embodiment, first transparent resin layer 21 is arcuated and is not parallel to image pickup surface 5.

Figure 7:
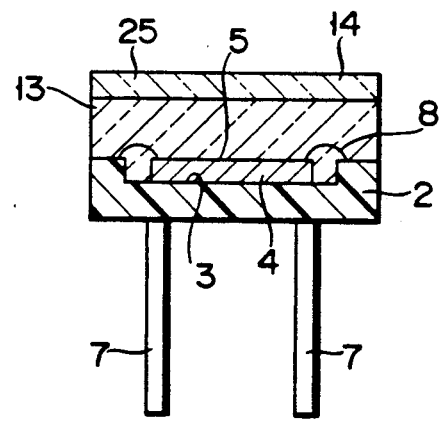
FIG. 7 is a sectional view showing a basic structure of a solidstate image pickup device according to a fourth embodiment of the present invention.

FIG. 7 shows a fourth embodiment of the present invention. A transparent plate 25 such as a glass plate having flat upper and lower surfaces is formed on transparent resin layer 13. The horizontal cross-sectional shape of plate 25 is the same as those of package 2 and layer 13.

Figure 8:
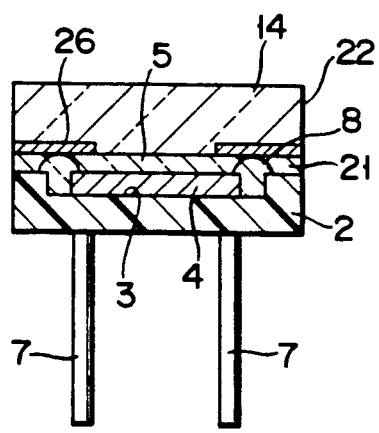
FIG. 8 is a sectional view showing a basic structure of a solid-state image pickup device according to a fifth embodiment of the present invention.
Figure 9:
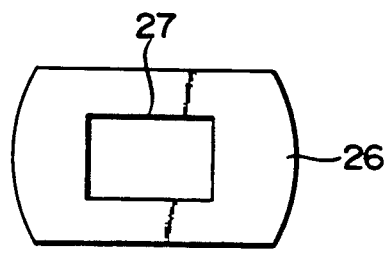
FIG. 9 is a plan view of a flare preventive plate of the solid-state image pickup device shown in FIG. 9.

FIG. 8 shows a fifth embodiment of the present invention. The transparent resin layer 14 is constituted by two layers 21, 22 in the same manner as in the second embodiment. However, unlike the second embodiment, flare preventive plate 26 with a rectangular window 27 is inserted at a boundary between first transparent resin layer 21 and second transparent resin layer 22. Plate 26 has a shape shown in FIG. 9. A light image vertically on surface 14 is guided to surface 5 through window 27. Light rays incident outside this normal incident path are shielded by plate 26 and are not incident on surface 5, thereby preventing the flare phenomenon. In particular, when device 1 is inserted into and supported by a pipe-like holding frame (not shown), light rays reflected by the inner surface of the support frame can also be shielded.

Figure 10:
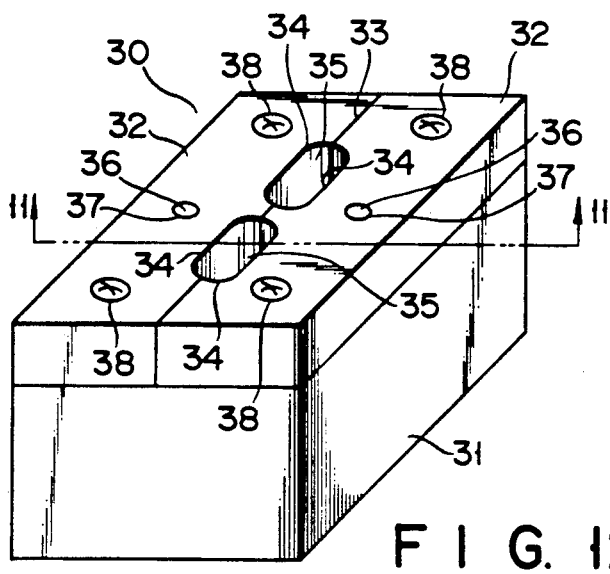
FIG. 10 is a perspective view of a mold.
Figure 11:
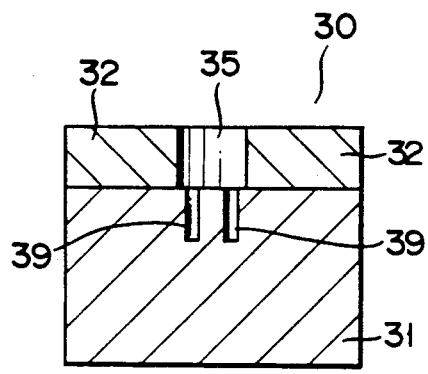
FIG. 11 is a side sectional view of the mold of FIG. 10 taken along the line 11-11 thereof.
Figure 12:
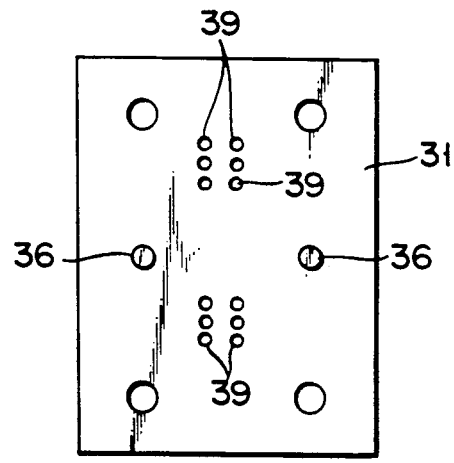
FIG. 12 is a plan view of a base of the mold of FIG. 10, FIGS. 13 to 16 are sectional views sequentially showing the steps in manufacturing the solid-state image pickup device.

Methods of manufacturing devices 1 will be described. First, a method of manufacturing device 1 of the first embodiment will be described. Before such a description, a mold 20 shown in FIGS. 10 to 12 will be described. A pail of right and left mold halves 32 are detachably mounted on an upper surface of a base 31. Two recesses 34 of surface 33 of right mold half 32 are formed at positions corresponding to recesses 34 of surface 33 of left mold half 32, thereby constituting two molding cavities 35. Guide holes 37 are formed in right and left mold halves 32, respectively. Guide pins 36 are to be inserted in corresponding guide holes 37. As shown in FIG. 12, pins 36 are vertically extended from the upper surface of base 31. When mold halves 32 are set in a closed state onto base 31, pins 36 are fitted in holes 37 to set mold halves 32 in position. Mold halves 32 are fixed by screw 38 at predetermined positions on base 31. As shown in FIG. 12, escape holes 39 are formed in the upper surface of base 31 at a location corresponding to cavities 35, so that legs 7 of device 1 can be inserted in holes 39.

Figure 13:
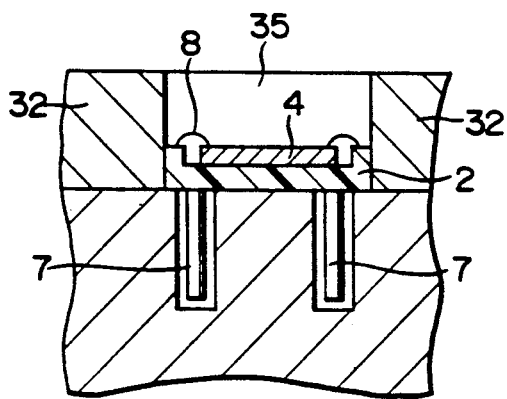

Device 1 of the first embodiment is manufactured according to the following steps. Mold 30 is assembled, and grease is applied to the bottom surface of each cavity 35 constructed by the upper surface of base 31. A mold release agent is applied to side wall surfaces of each cavity 35 (the mold release agent may be applied to the entire surface of cavity 35). Mold 30 is placed on a hot plate and heated to a temperature at which chip 4 will not be damaged by heat, preferably about 80° C. Thereafter, as shown in FIG. 13, package 2 with chip 4 fixed thereon is placed in cavity 35. In this case, legs 7 are respectively inserted in holes 39. The side surfaces of package 2 are brought into tight contact with the wall surfaces of cavity 35, such that spaces are formed between the wall surfaces and portions corresponding to grooves 9.

Figure 14:
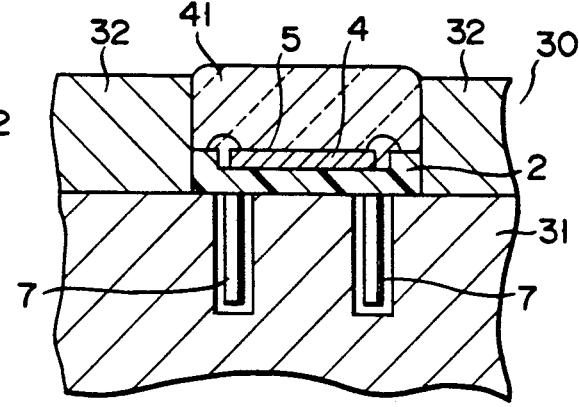

Then package 2 is respectively set in cavity 35, transparent resin 41 such as epoxy resin in a fluid state is poured, as shown in FIG. 14. The upper surface of resin 41 sightly extends upward from the upper surface of cavity 35.

Figure 15:
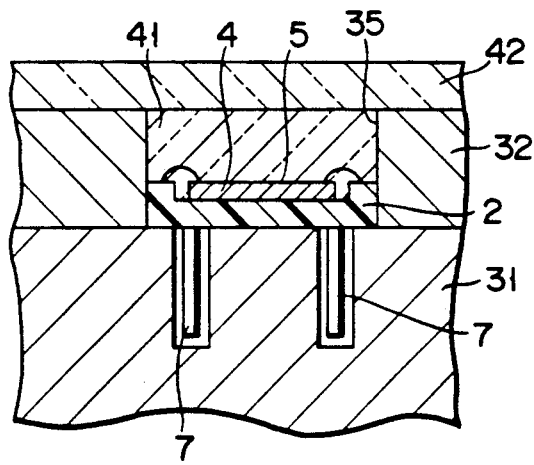
Figure 18:
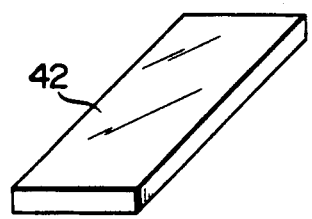
FIG. 18 is a perspective view of a glass plate.

A glass plate 42 with a flat lower surface as a forming member, shown in FIG. 18, is pressed on the extended portion from the opening of each cavity 35 to flatten the upper surface of resin 41, as shown in FIG. 15. In this case, plate 42 covers the entire area of the opening of each cavity 35 and at the same time abuts against the upper surface of mold 30. Since the upper surface of mold 30 is parallel to image pickup surface 5 of chip 4, the upper surface of resin 41 is also parallel to surface 5. Excess resin 41 overflows from cavity 35 and is horizontally moved to constitute burrs. A mold release agent is applied to at least a portion of plate 42 which is to be brought into contact with the upper surface of resin 41. This mold release treatment is necessary since plate 42 tends to be adhered to resin 41. This treatment will be described later.

After this process, resin 41 is dried and cured. For example, resin 41 is exposed at a temperature of 88° C. for about 16 hours.

Figure 16:
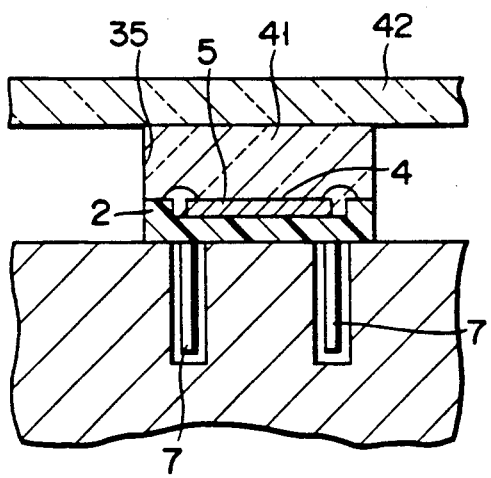

After drying and curing, screws 38 are removed, and pins 36 are moved downward into base 31. Only mold halves 32 are horizontally removed while plate 42 is held on the upper surface of resin 41, as shown in FIG. 16.

Plate 42 is removed, and burrs are then removed from resin 41. Device 1 is removed from mold 30.

In the fabrication process of devices 1 of the second and third embodiments, before or after each package 2 is placed in corresponding cavity 35, resin is coated or poured in cavity 35 to form layer 21. In the fabrication process of device 1 of the fifth embodiment, plate 26 is fitted in cavity 35 before rein of layer 21 is cured. Thereafter, a resin for layer 22 is poured in cavity 35. Other steps are the same as those in the fabrication process of device 1 of the first embodiment.

A VYDAX-AR (trademark, available from E.I. DuPont De Nemours Co.) can be used as a mold release agent to be coated on the wall surfaces of cavity 35. The VYDAX-AR is a white, short-chained tetrafluoroethylene telomer dispersed in a solvent of trichlorotrifluoroethane ($CCl_2F$ - $CClF_2$), which is available from E.I. DuPont De Nemours Co. This mold release agent can be simply applied to the wall surfaces of cavity 35. However, if the agent is baked, its durability can be improved. Hot air of 299° C. to 316° C. is blown on the mold release agent for 20 minutes for baking.

Figure 20:
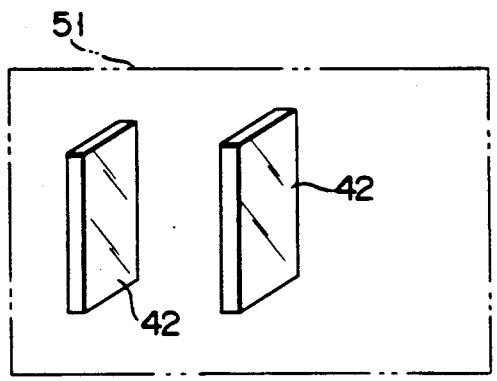
FIG. 20 is a representation for explaining drying of the mold release agent coated n the glass plate.
Figure 19:
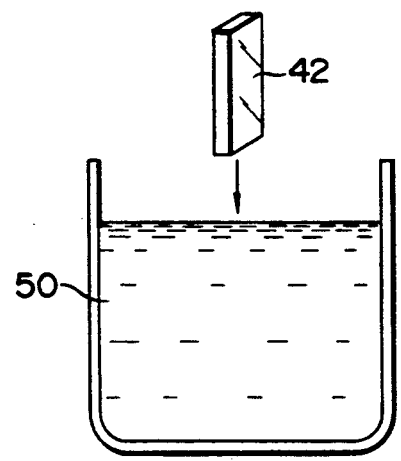
FIG. 19 is a representation for explaining application of a mold release agent for the glass plate.

Plate 42 is released from resin 41 in the following manner. Plate 42 shown in FIG. 18 is cleaned with an ultrasonic wave. Plate 42 is then dipped in treatment agent 50, as shown in FIG. 19. Plates 42 are then baked in a heating furnace 51 shown in FIG. 20. Agent 50 may be a teflon- silicone-based agent. A silicone-based agent is exemplified by a mixture of xylene and KS700 (trademark, available from Shinetsu Silicon KK) at a ratio (% by weight) of 2 : 3. Plates 42 are exposed in furnace 51 at a temperature of 220° C. to 260° C. for one to three hours. Preferably, plates 42 are baked at a temperature of 240° C. for 2 hours. The baking process need not be performed, but can improve durability.

The forming member is not limited to a glass forming member. When a transparent forming member is used, a resin state (genelation of bubbles) can be monitored, thus preventing operation failure. If the forming member has a flat resin contact surface, the member need not be a plate-like member.

Figure 17:
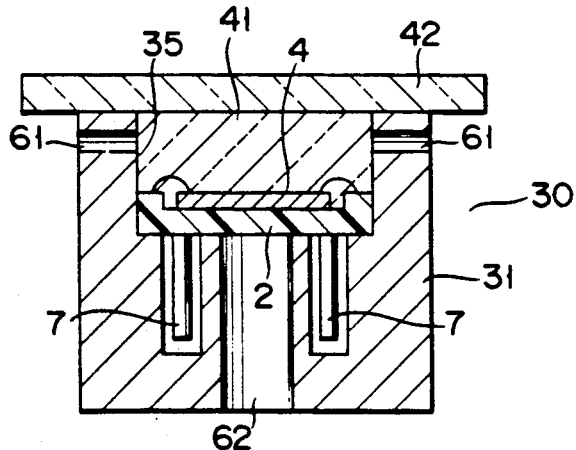
FIG. 17 is a sectional view showing another mold.

FIG. 17 shows a modification of mold 30. Cavity 35 is formed in base 31 of mold 30. Resin injection holes 61 are formed in the side walls of mold 30 to communicate with the cavity 35. In the process for injecting resin in cavity 35, the opening of cavity 35 is covered with glass plate 42 in advance. A transparent resin is injected from one hole 61 to fill cavity 35 with compressed resin. Hole 62 is formed in the bottom wall of cavity 35. A pin or the like is inserted in hole 62 to push on the finished device for removing it from mold 30.

In the fabrication of the fourth device 1, after a transparent resin is injected in cavity 35, a glass plate (without mold release treatment) with a size corresponding to that of cavity 35 is fitted in cavity 35. This glass plate is adhered to the resin. The resultant structure is dried and cured, and the finished device is removed.

The mold is not limited to a metal mold, but can be constituted by a mold with some elasticity. Contact precision between the package and the elastic mold is better with such an elastic mold.

In addition to epoxy resin, a silicone resin can also be used as the transparent resin. Particularly, a silicone resin is elastic. Where a glass is mounted on the surface, the glass tends to peel off the surface of the resin because of the difference in thermal expansion coefficient between the glass and the resin. In the case of the silicone resin, however, the glass does not peel off the resin in spite of the change in temperature because the silicone resin, which is elastic, absorbs the expansion of the glass.

According to the present invention as described above, the dimensions of the image pickup device along an image pickup surface direction can be reduced, and the structure of the device can be simplified. The upper surface of the solid-state image pickup device including the image pickup surface is sealed, and thus durability of the device can be improved Such a solidstate image pickup device can be easily and systematically fabricated.

We claim:

1. A method of manufacturing a solid-state image pickup device, comprising the following steps are performed in the same sequence as stated:

placing a package in a molding cavity of a mold member so that the package is mounted on the bottom surface of the cavity, said package having a semiconductor chip mounted on the upper surface thereof and lead legs downwardly extended therefrom, with the lead legs being inserted in holes formed in the bottom surface of the cavity, and an image pickup surface of the semiconductor chip being directed toward an opening formed in a top surface of the mold member and being parallel with the top surface;

pouring a transparent resin in a fluid state into the molding cavity so that substantially the entire upper surface of the resin extends upward from the top surface of the mold member through said opening;

mounting a forming member onto the top surface of the mold member so that a flat under surface of the forming member removes the upwardly extended portion of the resin and contacts the top surface of the mold member to cover the opening, whereby the under surface of the forming member contacts the resin and is parallel to the image pickup surface of said semiconductor chip placed in the molding cavity;

curing the transparent resin in the fluid state; and releasing said forming member and package from the mold member, and said forming member from the cured transparent resin, after the curing step.

2. The method according to claim 1, wherein said mold member comprises a base having an upper surface constituting said bottom surface of the mold cavity, a pair of mold halves removably mounted on the upper surface of the base, each mold half including an end face and a recess formed in the end face so that when the mold halves are combined with each other and with the base, the end faces of the mold halves contact each other so that the recesses of the mold halves form said mold cavity together with the upper surface of the base, and fixing means for fixing the mold halves to the base thereon.

3. The method according to claim 2 wherein said releasing step includes a step of moving the mold halves along the upper surface of the base so that they are removed from the cured synthetic resin and package, and a step of removing the forming means from the cured synthetic resin.

* * * * *

UNITED STATES PATENT AND TRADEMARK OFFICE
CERTIFICATE OF CORRECTION

PATENT NO. : 5,098,630
DATED : March 24, 1992
INVENTOR(S) : OGIU et al

It is certified that error appears in the above-identified patent and that said Letters Patent is hereby corrected as shown below:

TITLE PAGE:

Section [30] Foreign Application Priority Data -

Replace "PCT/JP 88/00115" with --PCT/JP 86/00115--.

Section [56] References Cited, right column, under "Foreign Patent Documents" -

- Replace "18941" with --60-18941--.

- Replace "110174" with --59-110174--.

Signed and Sealed this

Tenth Day of August, 1993

Attest:

MICHAEL K. KIRK

Attesting Officer

Acting Commissioner of Patents and Trademarks